United States Patent
Lee (10) Patent No.: US 6,764,915 B2
(45) Date of Patent: Jul. 20, 2004

(54) METHOD OF FORMING A MIM CAPACITOR STRUCTURE

(75) Inventor: Chiu-Te Lee, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/065,915

(22) Filed: Nov. 28, 2002

(65) Prior Publication Data

US 2003/0219983 A1 Nov. 27, 2003

Related U.S. Application Data

(62) Division of application No. 10/063,897, filed on May 22, 2002.

(51) Int. Cl.[7] .............................................. H01L 21/20
(52) U.S. Cl. ...................... 438/396; 438/397; 438/398; 438/399; 438/768
(58) Field of Search ................................ 438/396–399, 438/386, 387, 240, 241, 253, 466, 768

(56) References Cited

U.S. PATENT DOCUMENTS

| 5,047,367 A | * | 9/1991 | Wei et al. ................... 437/200 |
| 6,432,798 B1 | * | 8/2002 | Liu et al. ................... 438/396 |
| 6,627,939 B2 | * | 9/2003 | Yamaguchi ................. 257/301 |
| 2002/0179952 A1 | * | 12/2002 | Nakata ....................... 257/303 |

* cited by examiner

Primary Examiner—Duy-Vu Deo
(74) Attorney, Agent, or Firm—Winston Hsu (57) ABSTRACT

A metal-insulator metal (MIM) capacitor structure has a copper layer within a dielectric layer positioned on a substrate, an alloy layer atop the copper layer, a metal oxide layer atop the alloy layer and a top pad layer atop the metal oxide layer.

9 Claims, 8 Drawing Sheets

Fig. 8

METHOD OF FORMING A MIM CAPACITOR STRUCTURE

CROSS REFERENCE TO RELATED APPLICATIONS

This application is a division of application Ser. No. 10/063,897 filed on May 22, 2002.

BACKGROUND OF INVENTION

1. Field of the Invention

The present invention relates to a method of forming a metal-insulator-metal (MIM) capacitor structure, and more specifically, to a method of forming a MIM capacitor structure with a copper electrode.

2. Description of the Prior Art

In semiconductor manufacturing processes, metal capacitors formed of metal-insulator-metal (MIM) are widely used in the design of the semiconductor devices. Because a MIM capacitor has low resistance and low parasitic capacitance, and has no problems in shifts of depletion induced voltage, MIM capacitors have become the main structure used for metal capacitors. It is therefore important to develop a MIM capacitor that comprises copper electrodes with low resistance.

Figure 1:
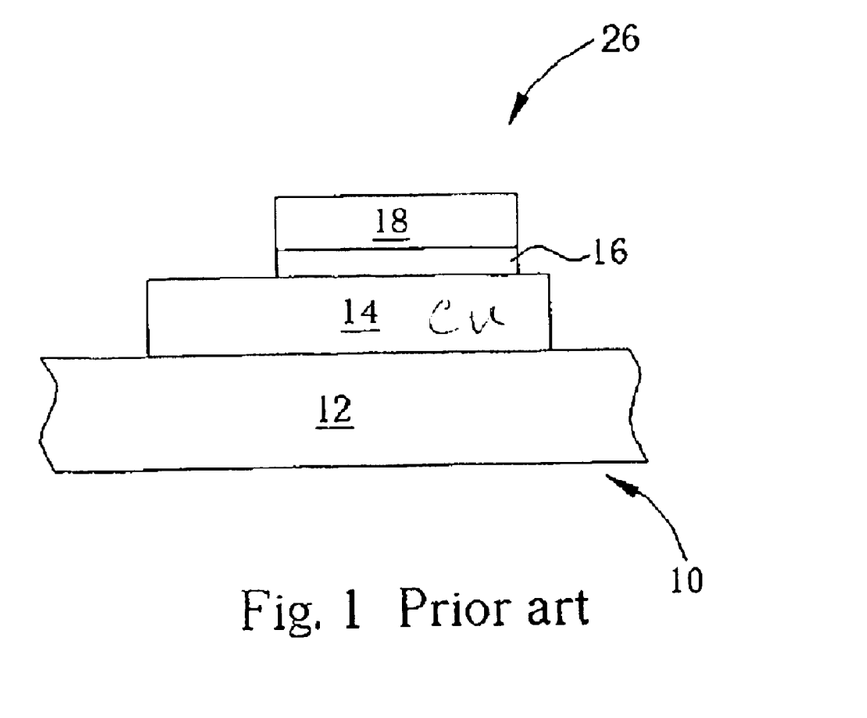
FIG. 1 and FIG. 2 are schematic views of forming a metal capacitor on a semiconductor wafer 10 according to the prior art.
Figure 2:
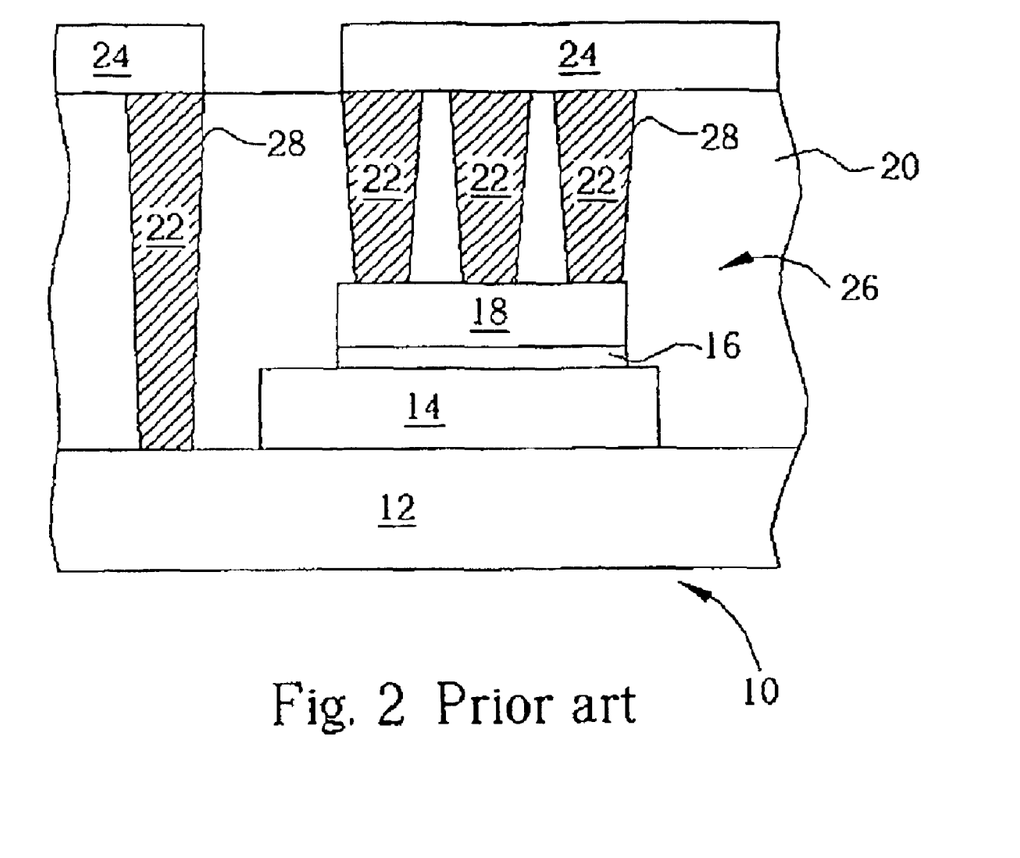

Please refer to FIG. 1 and FIG. 2. FIG. 1 and FIG. 2 are schematic views of forming a metal capacitor 26 on a semiconductor wafer 10 according to the prior art. As shown in FIG. 1, the semiconductor wafer 10 includes a substrate (not shown), and a dielectric layer 12 positioned on the substrate. In the prior art method, a metal bottom plate, composed of a copper layer, is evenly formed on the surface of the dielectric layer 12. An insulation layer and another metal layer are then respectively deposited on the surface of the metal bottom plate 14. A lithographic process is performed to define the patterns of a metal upper plate 18, and the excess portions of metal layer and insulation layer are removed to form the inter-metal insulator (IMI) 16 and the metal upper plate 18 so as to finish the formation of the metal capacitor 26.

As shown in FIG. 2, an inter-metal dielectric (IMD) layer 20 covers the metal capacitor 26, and a chemical mechanical polishing (CMP) process is used to planarize the surface of the inter-metal dielectric layer 20. A photoresist layer (not shown) is coated on the surface of the inter-metal dielectric layer 20, and a lithographic process is performed to define the position of via holes 28. The excess portions of the photoresist layer are then removed, and a dry etching process is performed, using the residual photoresist layer as a mask. The inter-metal dielectric layer 20 that is not covered by the mask is removed so as to form the via holes 28. The residual photoresist layer is then stripped.

A sputtering process is performed to form a metal layer (not shown) that fills the via holes 28. Either an etching back process or a chemical mechanical polishing (CMP) process is then performed to remove portions of the metal layer, so as to make a surface of the metal layer in the via holes 28 aligned with a surface of the inter-metal dielectric layer 20, forming the via plugs 22. A metal layer (not shown) is then evenly deposited on the surface of the inter-metal dielectric layer 20, and an etching process is performed to form a metal wire 24 on top of the via plugs 22. The via plugs 22 are used to electrically connect the metal wire 24 and the metal capacitor 26.

However, the bottom plate 14 is composed of copper and therefore has poor adhesion ability to the IMI 16, leading to a peeling phenomenon occurred between the bottom plate 14 and the IMI 16. In addition, the upward diffusion and side diffusion of the copper ions in the bottom plate 14 respectively into the IMI 16 and the inter-metal dielectric layer 20 frequently occur and make the electrical performance of the metal capacitor 26 defective. Consequently, the product with the metal capacitor 26 formed by the method revealed in the prior art turns to be less competitive in the market due to the unreliable performance.

SUMMARY OF INVENTION

It is therefore a primary object of the present invention to provide a method of forming a metal-insulator-metal (MIM) capacitor structure so as to prevent the diffusion of copper ions.

According to the claimed invention, the MIM capacitor structure comprises a copper layer, an alloy layer, a metal oxide layer and a top pad layer. The copper layer is formed within a dielectric layer on a substrate, and the alloy layer is formed on the copper layer. The metal oxide layer is positioned on the alloy layer with the top pad layer formed atop the metal oxide layer.

It is an advantage of the present invention against the prior art that a RTO process is performed to form the alloy layer on the copper layer. Simultaneously, the metal oxide layer, having excellent adhesion ability to the alloy layer, is formed on the alloy layer. The peeling phenomenon occurred between the metal bottom plate 14 and the IMI 16 in the prior art is therefore prevented. In addition, the alloy layer and the metal oxide layer are employed respectively as a first and a second copper-diffusion-preventing barrier layers. Both the side diffusion and the upward diffusion of the copper ions within the copper layer are therefore prevented. Consequently, the electrical performance and reliability of the MIM capacitor structure are properly assured.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 3:
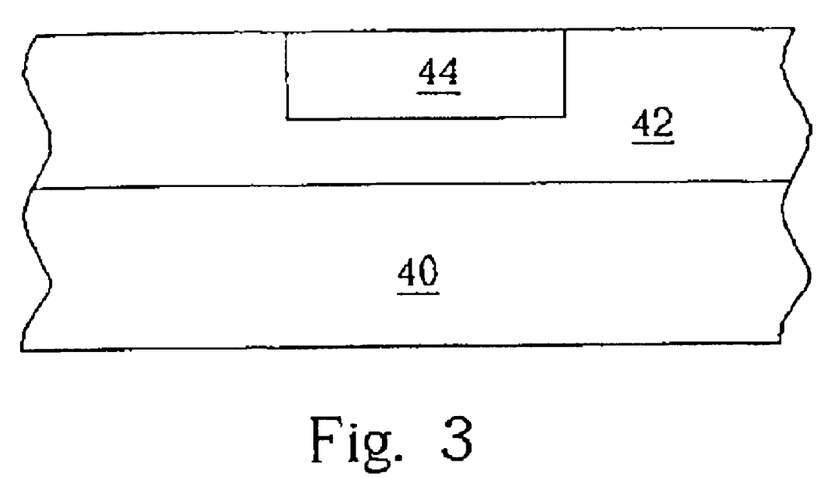
FIG. 3 to FIG. 7 are schematic views of forming a metal-insulator-metal (MIM) capacitor structure according to the present invention.

Please refer to FIG. 3 to FIG. 7 of schematic views of forming a metal-insulator-metal (MIM) capacitor structure according to the present invention. As shown in FIG. 3, a copper layer 44 is positioned within a dielectric layer 42 on a substrate 40. In the preferred embodiment of the present invention, the copper layer 44 is a copper wire of a dual damascene structure (not shown).

Figure 4:
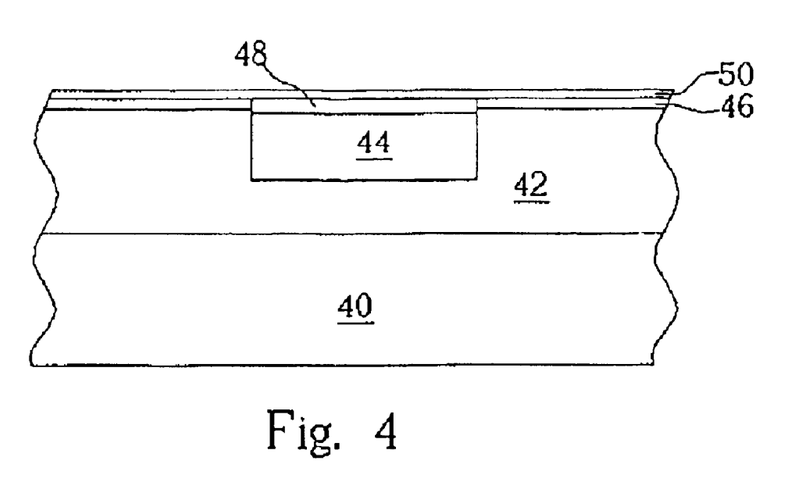

As shown in FIG. 4, a sputtering process is performed to form a first metal layer 46 on the copper layer 44 to completely cover the copper layer 44. A rapid thermal oxidation (RTO) process is then performed on the first metal layer 46 to simultaneously form an alloy layer 48 composed of a compound of the first metal layer 46 and the copper layer 44, and a metal oxide layer 50, which covers the first metal layer 46 and the alloy layer 48 and is employed as a capacitor dielectric layer of a MIM capacitor structure 56 (not shown in FIG. 4) formed in subsequent processes. The first metal layer 46 is composed of an element with high solid solubility in copper, and in the preferred embodiment of the present invention, the first metal layer is an aluminum layer (Al) layer. So that the alloy layer 48 is composed of Al—Cu alloy, and the metal oxide layer 50, having a thickness ranging from 500 to 1000 angstroms, is composed of aluminum oxide ($Al_2O_3$). The alloy layer 48 and the metal oxide layer 50 are employed respectively as a first copper-diffusion-preventing barrier layer and a second copper-diffusion-preventing barrier layer of the copper layer 44 to prevent the upward diffusion of copper ions within the copper layer 44.

Figure 5:
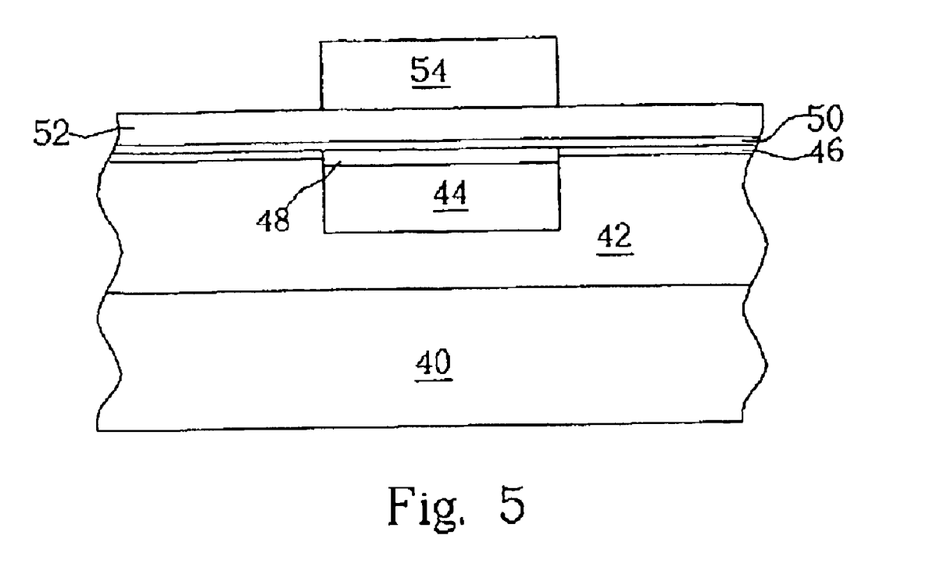

As shown in FIG. 5, a top pad layer 52, comprising either titanium nitride (TiN) or tantalum (TaN), is formed on the metal oxide layer 50 thereafter. A photoresist layer 54 is then formed to cover portions of the top pad layer 52 directly above the copper layer 44.

Figure 6:
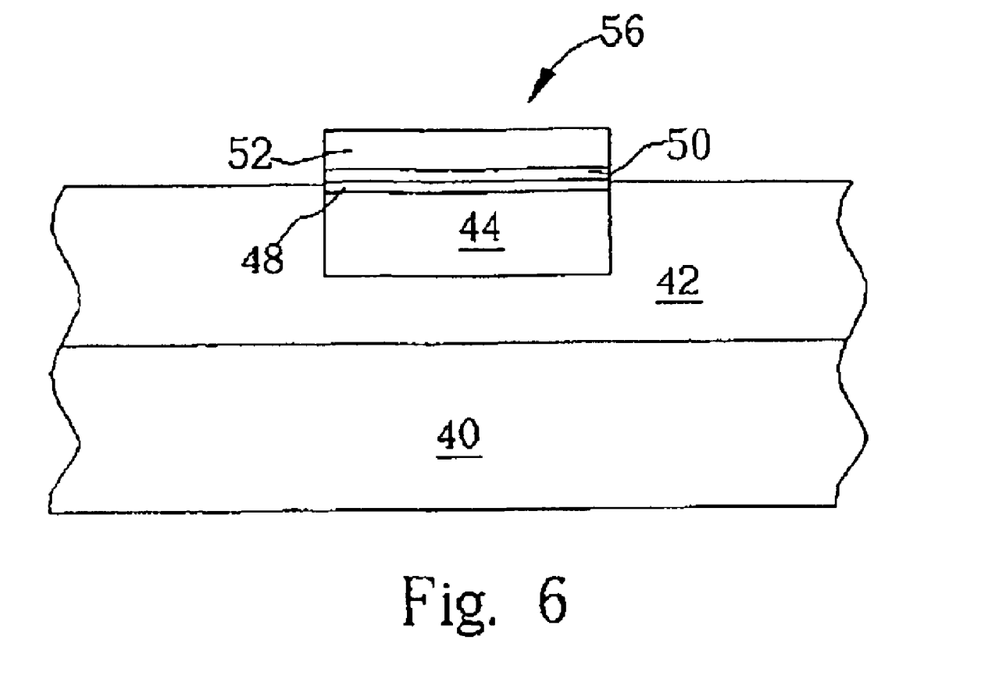

As shown in FIG. 6, by performing a lithography process and an etching process, using the alloy layer 48 as a stop layer, portions of the top pad layer 52, metal oxide layer 50 and the first metal layer 46 are removed. Finally, the photoresist layer 54 is removed to form the MIM capacitor structure 56.

Figure 7:
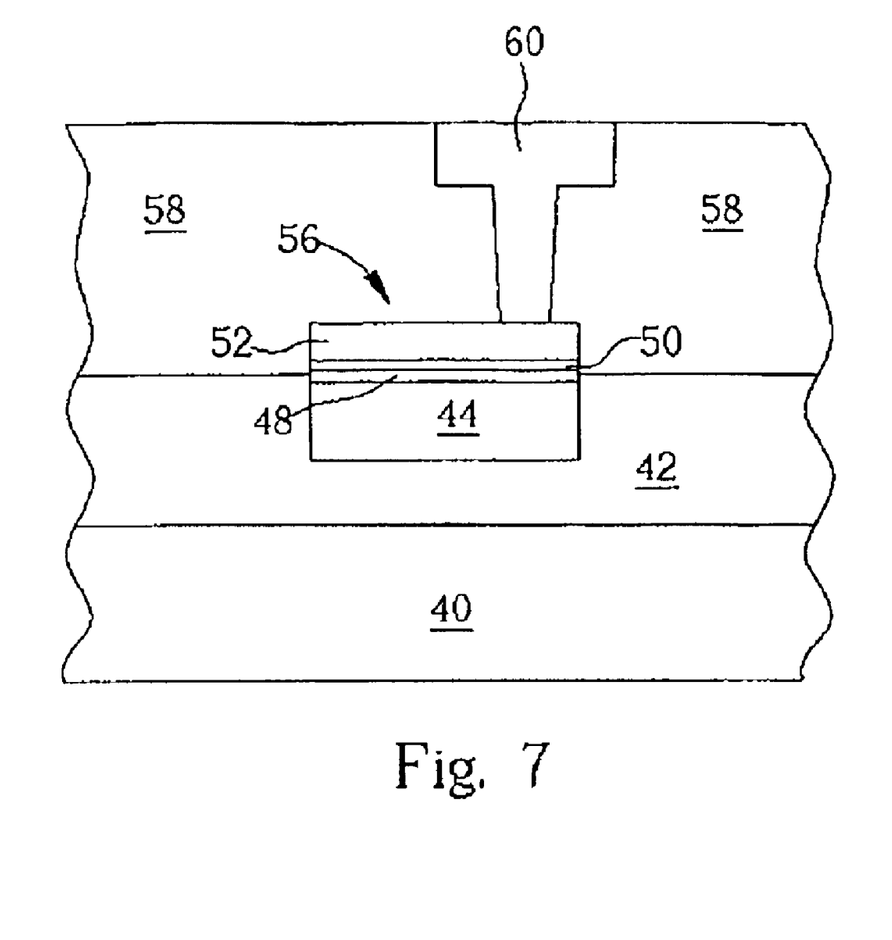

The copper layer 44 and the alloy layer 48 are employed as a bottom electrode plate of the MIM capacitor structure 56, the metal oxide layer 50 is employed as a capacitor dielectric layer of the MIM capacitor structure 56, and the top pad layer 52 is employed as a top electrode plate of the MIM capacitor structure 56. In subsequent processes, a dielectric layer 58 is frequently formed to cover the MIM capacitor structure 56 with a plug 60, electrically connected to the top pad layer 52, formed within the dielectric layer 58 due to product requirements, as shown in FIG. 7. Another plug (not shown) positioned in the damascene structure (not shown) under the copper layer 44 is employed to electrically connect the bottom electrode plate of the MIM capacitor structure 56 with circuits (not shown) of the device.

Figure 8:
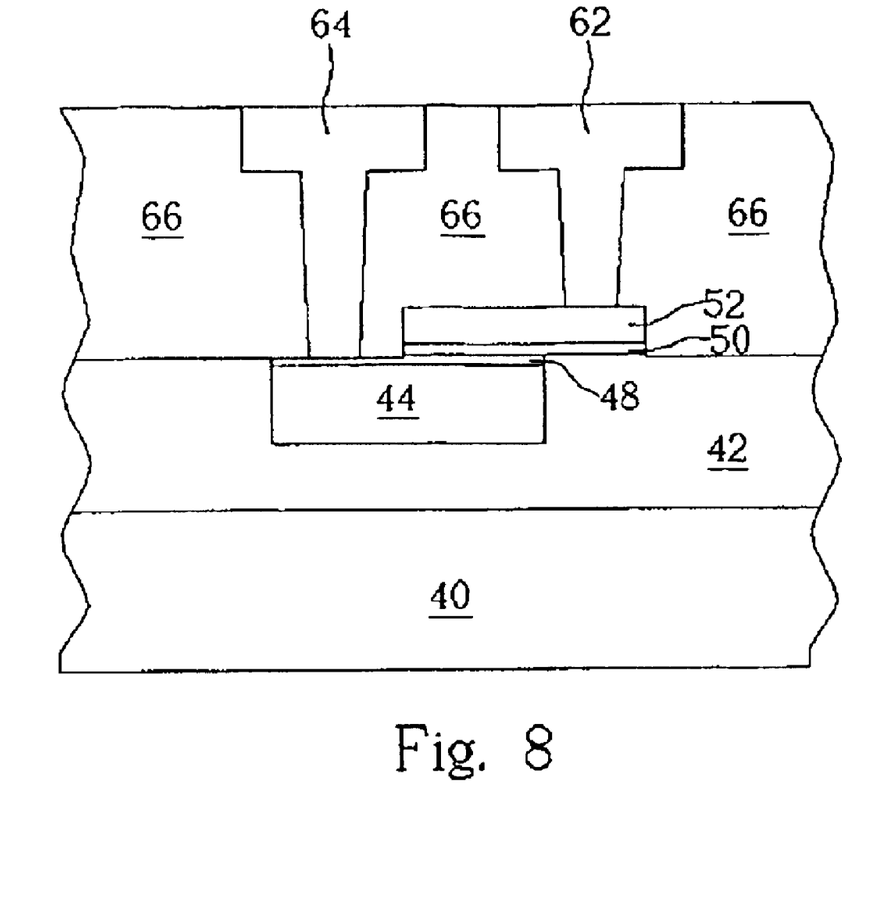
FIG. 8 is the schematic view of another embodiment of the MIM capacitor structure according to the present invention.

Please refer to FIG. 8 of the schematic view of another embodiment of the MIM capacitor structure 56 according to the present invention. As shown in FIG. 8, the metal oxide layer 50 and the top pad layer 52 cover portions of the alloy layer 48 and the copper layer 44, and a top surface of the alloy layer 48 is approximately aligned with a top surface of the dielectric layer 42. In subsequent processes, a dielectric layer 66 is frequently formed to cover the MIM capacitor structure 56 due to product requirements. A first via plug 62, electrically connected to the top pad layer 52, and a second via plug 64, electrically connected to portions of the alloy layer 48 not covered by the metal oxide layer 50, are then formed. The functions of the first metal layer 46, alloy layer 48, metal oxide layer 50 and the top pad layer 52 in this embodiment and the processes for forming the same are same as the functions and processes revealed in preceding paragraphs, and are neglected for simplicity of description.

In comparison with the prior art, the present invention is to form the first metal layer 46 on the copper layer 44, and then perform a RTO process to simultaneously form the alloy layer 48, self-aligned with the copper layer 44 to cover the top surface of the copper layer 44, and the metal oxide layer 50, having excellent adhesion ability to the alloy layer 48, on the alloy layer 48. The peeling phenomenon occurred between the metal bottom plate 14 and the IMI 16 in the prior art is therefore prevented. In addition, the alloy layer 48 and the metal oxide layer 50 are employed respectively as the first and the second copper-diffusion-preventing barrier layers. Both the side diffusion and the upward diffusion of the copper ions within the copper layer 44 are therefore prevented. Consequently, the electrical performance and reliability of the MIM capacitor structure 56 are properly assured.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of forming a MIM capacitor structure on a substrate, the substrate comprising a first metal layer on a top surface of the substrate, the method comprising:

performing a sputtering process to form a second metal layer completely covering the first metal layer;

performing a rapid thermal oxidation (RTO) process to simultaneously transfer portions of the second metal layer adjacent to a top surface of the first metal layer and portions of the first metal layer to form an alloy layer, and oxidizing the remaining portions of the second metal layer to form a metal oxide layer; and forming a top pad layer on the metal oxide layer.

2. The method of claim 1 wherein the first metal layer is a copper wire of a dual damascene structure.

3. The method of clam 1 wherein a bottom electrode plate of the MIM capacitor structure comprises the first metal layer and the alloy layer, a capacitor dielectric layer of the MIM capacitor structure comprises the metal oxide layer, and a top electrode plate of the MIM capacitor structure comprises the top pad layer.

4. The method of claim 1 wherein the metal oxide layer is employed as an insulator layer.

5. The method of claim 1 wherein the second metal is an element with high solid solubility in the first metal layer.

6. The method of claim 5 wherein the second metal is aluminum.

7. The method of claim 1 wherein the alloy layer is employed as a first copper-diffusion-preventing barrier layer of the first metal layer.

8. The method of claim 1 wherein the metal oxide layer is employed as a second copper-diffusion-preventing barrier layer of the first metal layer.

9. The method of claim 1 wherein the top pad layer comprises either titanium nitride or tantalum nitride.

* * * * *